United States Patent [19]

Gallagher et al.

[11] Patent Number: 4,968,644

[45] Date of Patent: Nov. 6, 1990

[54] METHOD FOR FABRICATING DEVICES AND DEVICES FORMED THEREBY

[75] Inventors: Patrick K. Gallagher, Basking Ridge; Martin L. Green, New Providence; Roland A. Levy, Berkeley Heights, all of N.J.

[73] Assignee: AT&T Bell Laboratories, Murray Hill, N.J.

[21] Appl. No.: 193,179

[22] Filed: May 5, 1988

Related U.S. Application Data

[63] Continuation of Ser. No. 874,475, Jun. 16, 1986, abandoned.

[51] Int. Cl.$^5$ .................. H01L 21/28; H01L 21/60
[52] U.S. Cl. .................................. 437/192; 437/190; 437/203
[58] Field of Search ............... 437/180, 189, 203, 192

[56] References Cited

U.S. PATENT DOCUMENTS

| | | | |
|---|---|---|---|
| 4,343,676 | 8/1982 | Tarng | 437/228 |
| 4,349,408 | 9/1982 | Tarng et al. | 427/253 |
| 4,359,490 | 11/1982 | Lehrer | 437/233 |
| 4,501,769 | 2/1985 | Hieber | 437/200 |
| 4,517,225 | 5/1985 | Broadbent | 427/89 |
| 4,532,702 | 8/1985 | Gigante et al. | 29/591 |
| 4,540,609 | 9/1985 | Tsao | 427/253 |
| 4,552,783 | 11/1985 | Stoll et al. | 427/91 |
| 4,582,563 | 5/1986 | Hazuki et al. | 427/90 |
| 4,595,608 | 6/1986 | King et al. | 427/248.1 |
| 4,597,167 | 7/1986 | Moriya et al. | 29/591 |
| 4,617,087 | 10/1986 | Iyer et al. | 29/591 |
| 4,629,635 | 12/1986 | Brors | 427/95 |

FOREIGN PATENT DOCUMENTS

| | | |
|---|---|---|
| 047913 | 7/1985 | European Pat. Off. . |
| 0178200 | 4/1986 | European Pat. Off. . |
| 0194950 | 9/1986 | European Pat. Off. . |
| 0072132 | 10/1982 | Japan . |
| 57925 | 4/1985 | Japan . |

OTHER PUBLICATIONS

Morosanu et al., "Kinetics and Properties of Chemically Vapour Deposited Tungsten Films on Silicon Substrates," *Thin Solid Films*, 52 (1978), 181-194.

Miller et al., "Hot-Wall CVD Tungsten for VLSI," *Solid State Technology*, 79-82 (1980).

Broadbent et al., "Selective Low Pressure Chemical Vapor Deposition of Tungsten," *Extended Abstracts*, The Electrochemical Society Spring Meeting, San Francisco, Calif., Abstract 420 (1983).

R. A. Gargini, "Tungsten Barrier Eliminates VLSI Circuit Shorts", *Vacuum Technology*, 141-147 (1983).

Tsao et al., "Low Pressure Chemical Vapor Deposition of Tungsten on Polycrystalline and Single-Crystal Silicon via the Silicon Reduction" *J. Electrochemical Society*, Nov. 1984, pp. 2702-2708.

R. A. Levy et al., "Selective LDCVD Tungsten for Contact Barrier Applications", *Journal of the Electrochemical Society*, vol. 133, No. 9, Sep. 1986, pp. 1905-1912.

M. L. Green et al., "Structure of Selective Low Pressure Chemically Vapor-Deposited Films of Tungsten", (List continued on next page.)

*Primary Examiner*—Olik Chaudhuri
*Assistant Examiner*—Andrew Griffis
*Attorney, Agent, or Firm*—Eugene E. Pacher

[57] ABSTRACT

A method for fabricating a device, e.g., a semiconductor device, is disclosed which includes the step of reacting at least two reactive entities to form a metal-containing material on a region or regions of a processed or unprocessed substrate. Inherent in the method is the recognition that one of the reactive entities will often react with substrate material to produce previously unrecognized, and highly undesirable, results, e.g., the almost complete erosion of previously fabricated device components. Thus, and in accordance with the inventive method, any one of a variety of techniques is employed to reduce the reaction rate between the substrate material and the entity reacting with this material, while avoiding a substantial reduction in the reaction rate between the two entities.

18 Claims, 5 Drawing Sheets

OTHER PUBLICATIONS

Journal of the Electrochemical Society, vol. 132, No. 5, May 1985, pp. 1243–1250.

K. C. Saraswat et al., "Selective CVD of Tungsten for VLSI Technology", *Extended Abstracts,* vol. 84, No. 1, May 6–11, 1984, pp. 114–115.

J. Y. Chen et al., "Refractory Metals and Metal Silicides for VLSI Devices", Solid State Technology, vol. 27, No. 8, Aug. 1984, pp. 145–148.

Morosancu et al., "Kinetics and Properties of Chemically Vapour-Deposited Tungsten Films on Silicon Substrates", Thin Solid Films, 52 (1978), 181–194.

Schmitz et al., "Comparison of Step Coverage and Other Aspects of the $H_2/WF_6$ and $Sitty/WF_6$ Reduction Schemes Used in Blanket LPCVD of Tungsten", Procs. Tenth Conf. on Chem Vol. Dep. (Electrochem Soc.), Edited by Cullen et al., vol. 87-8, Oct. 1987.

Swirhum et al., "Contact Resistance of LPCVD W/Al and Ptsi/W/Al Metallization", 8179, IEEE Electron Device Letters, EDL-5 (1984), Jun. No. 6, NY, pp. 209–211.

METHOD FOR FABRICATING DEVICES AND DEVICES FORMED THEREBY

This is a continuation of U.S. application Ser. No. 874,475 filed by P. K. Gallagher, M. L. Green and R. A. Levy on Jun. 16, 1986, now abandoned.

BACKGROUND OF THE INVENTION

1. Field of the Invention

The invention pertains generally to a method for fabricating devices, e.g., semiconductor devices, as well as the resulting devices.

2. Art Background

The deposition of metal-containing materials, i.e., pure metals, molecular-type materials in which the molecules include one or more metal atoms, and/or mixtures which include one or more of the above, onto a processed or unprocessed substrate plays a significant role in the fabrication of a variety of devices. Such devices include, for example, discrete semiconductor devices, integrated circuit devices, and magnetic bubble devices. Typically, the deposition of, for example, a pure metal onto selected regions of a processed or unprocessed semiconductor substrate is accomplished by forming a patterned deposition mask, e.g., a patterned photoresist layer, on the substrate surface, and then e-beam evaporating or rf-sputtering the metal onto the mask-bearing substrate surface. Subsequent removal of the mask leaves the metal covering only the selected substrate regions. Alternatively, and without forming a deposition mask, the metal is deposited directly onto the substrate surface, and a patterned etch mask, e.g., a patterned photoresist layer, formed on the metal. Then, the metal is etched through the etch mask, and the etch mask is removed, again leaving metal only in the selected regions.

Included among the integrated circuit devices whose fabrication involves the deposition of metal-containing materials are many MOS (metal-oxide-semiconductor) integrated circuit devices, such as n-channel MOS, p-channel MOS, and CMOS (complementary MOS) integrated circuit devices. (The term integrated circuit, as used herein, denotes a plurality of interconnected, discrete devices.) These MOS integrated circuits (ICs) typically include a plurality of MOSFETs (metal-oxide-semiconductor field effect transistors), each of which includes an active surface layer of semiconductor material, e.g., silicon. Each MOSFET also includes a relatively thin gate oxide (GOX) formed on the surface of the active layer, a conducting gate of, for example, doped polycrystalline silicon (polysilicon), formed on the surface of the GOX, and two relatively heavily doped portions of the active layer, on opposite sides of the gate, which constitute the source and drain of the MOSFET. A relatively thick (compared to the GOX) field oxide (FOX) serves to separate and electrically insulate the MOSFETs from one another.

The MOS ICs, described above, also include metal, e.g., aluminum or aluminum-copper alloy, contacts to, and metal runners extending from, the sources, drains, and gates of the MOSFETs, through which electrical communication is achieved with the MOSFETs. These metal contacts and runners are formed using the deposition and patterning techniques, described above. That is, an electrically insulating glass, e.g., a glass which includes $SiO_2$—$P_2O_5$ or $SiO_2$—$P_2O_5$—$B_2O_3$, is first deposited onto the MOSFETs and FOX of an IC using conventional chemical vapor deposition (CVD) techniques, to serve as an interlevel dielectric (an electrically insulating layer) between the gate metallization and the source/drain metallization. Subsequently, the interlevel dielectric is patterned to form via holes to the sources, drains and gates. A metallic conductor, such as aluminum, is deposited, e.g., rf-sputtered or e-beam evaporated, onto the interlevel dielectric, as well as into the via holes, to form the electrical contacts to the sources, drains and gates. The deposited (onto the interlevel dielectric) aluminum is then etched through a patterned etch mask, e.g., a patterned photoresist layer, to form the interconnecting runners which terminate in contact pads.

Significantly, the deposition of metal-containing materials onto device substrates often involves undesirable interactions between the deposited material and the substrates. For example, semiconductor materials, such as silicon, exhibit a relatively high solubility in the deposited metals, such as aluminum, used in the electrical contacts to sources and drains, i.e., the silicon tends to diffuse into the aluminum to form aluminum-silicon alloys. As a consequence, aluminum from the overlying metal contacts diffuses into the underlying silicon to produce what are termed aluminum spikes. As is known, aluminum constitutes a p-type dopant for silicon. Thus, if an aluminum spike were to extend through an n-type source or drain (into a p-type substrate), the p-n junction at the source-substrate or drain-substrate interface would be eliminated. Because aluminum spikes typically extend less than about one micrometer ($\mu$m) into silicon, their presence is generally not significant in devices where the source and drain p-n junctions have depths greater than or equal to about 1 $\mu$m. Conversely, these spikes pose a serious problem in devices where the p-n junction depths are less than about 1 $\mu$m, the very type of devices which, it is expected, will shortly be coming into commercial use.

It has been proposed that aluminum spiking be prevented by replacing aluminum with a silicon-saturated aluminum-silicon alloy, i.e., an alloy which is saturated with silicon at the highest temperature to be encountered during processing. (Such an alloy largely eliminates the silicon concentration gradients at the interfaces between the aluminum and the sources and drains, and thus precludes diffusion of silicon from sources and drains into the metal contacts.) Unfortunately, and subsequent to the high-temperature processing, i.e., at room temperature, these alloys are supersaturated with silicon, which leads to precipitation of silicon (doped with aluminum). Such precipitation, in turn, results in the metal contacts to the n+ sources and drains (typically doped to a level greater than or equal to about $10^{19}$ cm$^{-3}$) exhibiting undesirably high contact resistivities, i.e., contact resistivities higher than about $10^{-5}$ ohm-cm$^2$, and thus exhibiting undesirably high contact resistances. (By contrast, the contact resistivities to the p+ sources and drains are only higher than or equal to about $10^{-6}$ ohm-cm$^2$.)

It has also been proposed that aluminum spiking be prevented, while avoiding high resistance contacts, by providing a barrier to interdiffusion of aluminum and silicon at the sources and drains. It has further been proposed that the barrier be of tungsten (W). One reason for this proposal is that it is known that tungsten can be selectively deposited onto sources and drains, without the use of a patterned deposition mask and without the need for subsequent etching, using either of two low pressure CVD (LPCVD) techniques. In accordance with the first technique, tungsten hexafluoride ($WF_6$) is flowed over a processed silicon substrate, after the via holes have been formed in the interlevel dielectric but before the aluminum has been deposited into the via holes. Because $WF_6$ is relatively inert with respect to the $SiO_2$ of the interlevel dielectric, the $WF_6$ preferentially reacts with the Si of the exposed source and drain regions to form W (a solid) on these regions and $SiF_4$ (a gas, exhausted from the reaction chamber) via the overall chemical reaction $$2WF_6 + 3Si \rightarrow 2W + 3SiF_4. \quad (1)$$

Although this reaction does involve removal (etching) of silicon from the sources and drains, it has always been believed that this is inconsequential. Further, it has been reported that the resulting tungsten layer is typically no more than about 150 Angstroms (Å) thick. Therefore, such a layer would be too thin to serve as an effective diffusion barrier between the aluminum and the silicon.

In accordance with the second technique for selectively depositing tungsten, both $WF_6$ and $H_2$ are flowed across the processed silicon substrate (with the total pressure of all the gases within the reaction chamber conventionally maintained at about 1 torr). Initially, the $WF_6$ reacts with the Si of the exposed sources and drains to form (as discussed above, what is reported to be) a relatively thin layer of W. Then, and provided the deposition temperature is greater than or equal to about 250 degrees Centigrade (C) but less than or equal to about 600 degrees C., it is believed the W covering the exposed source and drain regions, but not the $SiO_2$ of the interlevel dielectric, serves to catalyze a chemical reaction between the $WF_6$ and $H_2$ which yields additional W (formed on the sources and drains) and HF (a gas, exhausted from the reaction chamber) via the overall chemical reaction $$WF_6 + 3H_2 \rightarrow W + 6HF. \quad (2)$$

While the second technique does produce a sufficiently thick layer of tungsten to act as an effective diffusion barrier, it has been reported that aluminum contacts to (W-covered) $p^+$ source and drain regions, having depths of about 1 $\mu$m, exhibit undesirably high contact resistivities, i.e., contact resistivities higher than or equal to about $10^{-5}$ ohm-$cm^2$. (The contact resistivities to $n^+$ sources and drains, having depths of about 1 $\mu$m, were reported to be only higher than or equal to about $10^{-6}$ ohm-$cm^2$.)

Thus, those engaged in the development of device fabrication methods have sought, thus far without success, techniques for forming metal-containing materials on processed or unprocessed substrates which avoid the problems associated with previous such techniques.

SUMMARY OF THE INVENTION

The invention involves a device fabrication method which includes the step of reacting at least two entities for the purpose of forming a metal-containing material on a region, or regions, or all of a processed or unprocessed substrate. In many instances, this desired reaction is accompanied (or even preceded) by a second reaction between one (or more) of the reactive entities and substrate material, e.g., semiconductor material (to be found in an unprocessed or processed substrate), metal (to be found on a processed substrate), or $SiO_2$ (to be found on a processed substrate). Significantly, it has been found that the second reaction often leads to previously unrecognized, and highly undesirable, consequences. For example, when reacting $WF_6$ and $H_2$ (in accordance with the reaction given in Eq. (2)), to form W on the silicon surfaces of sources and drains, it is known that the $WF_6$ will necessarily also react with the silicon (in accordance with the reaction given in Eq. (1)), thus partially eroding the sources and drains. However, and contrary to previous beliefs that this erosion is inconsequential, it has been found that the degree of erosion of $n^+$ sources and drains is generally far greater than that of the $p^+$ sources and drains. In fact, it has been found that $n^+$ sources and drains having depths less than about 1 $\mu$m are often severely eroded, and sometimes almost entirely eroded away. In addition, it has been found that the contact resistivities of aluminum contacts to (W-covered) $p^+$ and $n^+$ sources and drains having depths less than about 1 $\mu$m are far higher than those previously reported to (W-covered) $p^+$ and $n^+$ sources and drains having depths greater than, or equal to, about 1 $\mu$m. For example, the contact resistivities to (W-covered) $p^+$ sources and drains having depths less than about 1 $\mu$m have been found to be higher than about $5 \times 10^{-5}$ ohm-$cm^2$. In addition, the contact resistivities to (W-covered) $n^+$ sources and drains having depths less than about 1 $\mu$m have been found to be higher than about $10^{-5}$ ohm-$cm^2$.

The inventive device fabrication method is distinguished from previous such methods in that it involves a variety of techniques for preventing, or significantly reducing the degree of, the adverse consequences associated with the second (undesirable) reaction. That is, techniques have been developed for reducing the rate of (the undesirable) reaction between the substrate material and one (or more) of the at least two reactive entities, without inducing a substantial reduction in the rate of the (desired) reaction between the at least two reactive entities. For example, when reacting $WF_6$ with $H_2$ to form W, it has been found that the reaction rate (associated with the undesirable reaction) between $WF_6$ and Si is reduced, without significantly reducing the reaction rate between $WF_6$ and $H_2$ by, for example, increasing the concentration of one of the products of the undesirable reaction, i.e., increasing the concentration of $SiF_4$ (above what normally occurs). By virtue of this technique (and others), the erosion of both $n^+$ and $p^+$ sources and drains is substantially reduced, the reduction being particularly significant in devices having $n^+$ sources and drains with depths less than about 1 $\mu$m. Moreover, and quite unexpectedly, the contact resistivities to both the $n^+$ and $p^+$ sources and drains are also substantially reduced, to levels less than or equal to about $10^{-6}$ ohm-$cm^2$.

BRIEF DESCRIPTION OF THE DRAWING

The invention is described with reference to the accompanying drawings, wherein.

DETAILED DESCRIPTION

Figure 1:
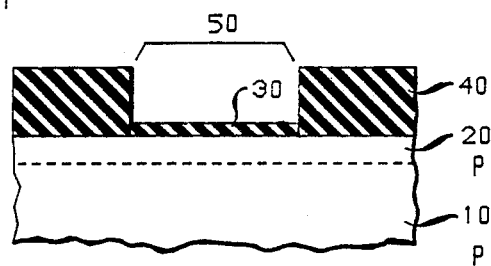
FIGS. 1-7 depict the steps involved in one embodiment of the inventive device fabrication method.
Figure 2:
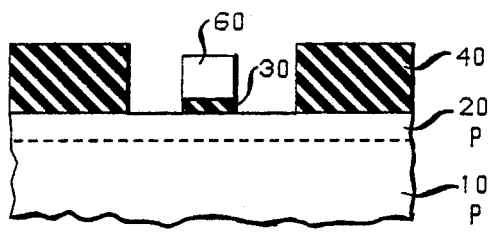
Figure 3:
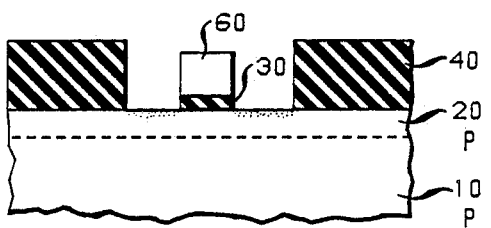
Figure 4:
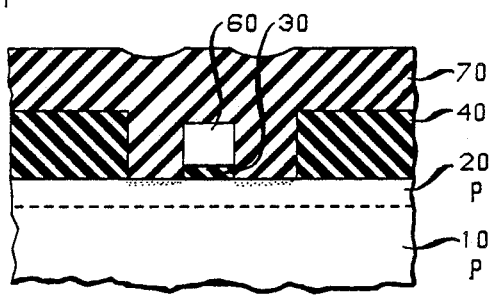
Figure 5:
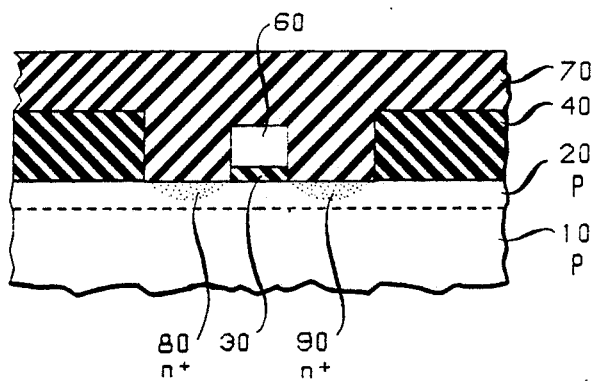
Figure 6:
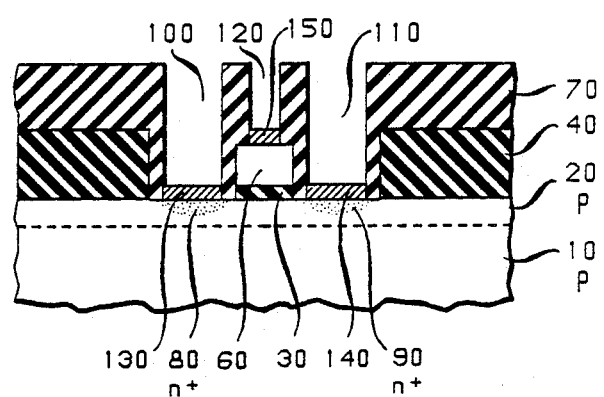
Figure 7:
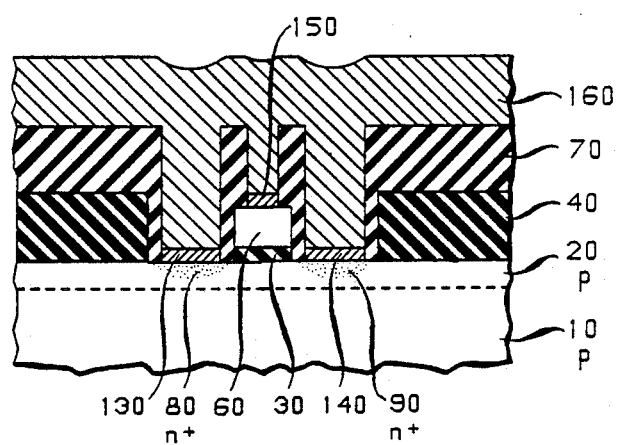

The invention involves a method for fabricating devices, e.g., discrete semiconductor devices, integrated circuit devices, and magnetic bubble devices, the method including the step of forming a metal-containing material on a region, or regions, or all of a processed or unprocessed substrate. The invention also involves the devices resulting from the inventive method.

The formation of a metal-containing material is achieved, in accordance with the invention, by reacting at least two reactive entities (other than substrate material), at least one of the entities including metal of the type contained in the metal-containing material. As discussed, the reaction between the at least two reactive entities is, in many instances, accompanied by a second reaction (or series of reactions) between one (or more) of the reactive entities and substrate material. As also discussed, this second reaction often produces previously unrecognized, and highly undesirable, results. To avoid, or significantly reduce the degree of, these undesirable results, and in accordance with the inventive device fabrication method, one (or more) of a variety of techniques is used to reduce the reaction rate associated with the second, undesirable reaction. Significantly, these techniques are chosen so that the reaction rate between the two reactive entities is not substantially reduced. (For purposes of the invention, such a substantial reduction is avoided provided the rate of formation of the metal-containing material is greater than about 1 Å per minute.)

Included among the techniques, referred to above, are those which involve altering (from what normally occurs), e.g., increasing, the concentrations of one or more of the products produced by the unwanted reaction, using total pressures (of the gases within the reaction chamber) which are different from those conventionally used, or using reaction temperatures which are different from those conventionally used. The technique (or techniques) to be used in any one particular situation must generally be determined through the use of control samples.

By way of example, and as discussed above, when reacting $WF_6$ with $H_2$ to form W on the silicon surfaces of MOSFET sources and drains, the $WF_6$ necessarily also reacts with the silicon to erode the sources and drains, the degree of erosion of the $n^+$ sources and drains being far greater than that of the $p^+$ sources and drains. In fact, and as noted above, $n^+$ sources and drains having depths less than about 1 $\mu$m are significantly eroded, and often almost entirely eroded away. (For purposes of the invention, the depth of a source or drain is defined to be the length of a perpendicular extending from a least-squares-fit planar approximation to the original substrate surface to the lowest point where the dopant concentration in the source or drain is equal to the dopant concentration in the surrounding substrate. This point is determined, for example, by SIMS analysis, or by conventional junction staining techniques. Regarding these staining techniques see, e.g., *Quick Reference Manual for Silicon Integrated Circuit Technology*, edited by W. E. Beadle et al (John Wiley and Sons, New York, 1985, section 5-9.)

As also noted, it has been found that the reaction rate for the undesirable reaction between $WF_6$ and Si is readily reduced, and thus the excessive etching of $n^+$ sources and drains is reduced, by, for example, increasing the concentration (above what normally occurs) of one of the products of the undesirable reaction, i.e., increasing the concentration of $SiF_4$. The greater the increase in the concentration of $SiF_4$, the greater is the desired effect. However, increasing the concentration of $SiF_4$ also tends to reduce the reaction rate between $WF_6$ and $H_2$. Thus, and in accordance with the invention, $WF_6$ and $H_2$ are flowed into the reaction chamber at respective flow rates of, for example, 10 sccm (standard cubic centimeters per minute) and 2000 sccm, and $SiF_4$ is flowed into the reaction chamber at a flow rate ranging from about 1 sccm to about 100 sccm. Flow rates of $SiF_4$ less than about 1 sccm are undesirable because they lead to undesirably small decreases in the reaction rate between $WF_6$ and Si. Flow rates of $SiF_4$ greater than about 100 sccm are undesirable because they lead to substantial reductions in the reaction rate between $WF_6$ and $H_2$.

It has also been found that increasing the total pressure within the reaction chamber above the conventional level of 1 torr also reduces the reaction rate between $WF_6$ and Si. In addition, the use of reaction temperatures outside the conventional temperature range, i.e., temperatures less than about 250 degrees C. and temperatures greater than about 600 degrees C., has the same desirable effect, although temperatures greater than about 600 degrees C. produce a reduction in the selectivity of W formation.

The techniques, described above, are not only useful in forming W, but are also useful in forming a wide variety of metal-containing materials. For example, metals such as molybdenum, tantalum, titanium and rhenium, and their corresponding silicides, are readily formed by reacting the fluorides or chlorides of these metals, e.g., $MoF_6$, $TaCl_5$, $TiCl_4$, and $ReF_6$, with a reducing agent such as $H_2$ (to form the metals) or $SiH_4$ (to form the silicides). As before, the metal fluorides or chlorides tend to react with silicon, producing the undesirable results, discussed above. However, the reaction rates associated with these undesirable reactions are readily reduced, using the techniques described above.

As a pedagogic aid to an even more complete understanding of the invention, the application of the invention device fabrication method to the fabrication of an MOS IC which includes an n-channel MOSFET, e.g., an n-channel MOS IC or a CMOS IC, is described below. Significantly, the n-channel MOSFET includes $n^+$ sources and drains having depths less than about 1 $\mu$m. Moreover, this MOSFET includes diffusion barriers, e.g., tungsten diffusion barriers, at the sources and drains, to prevent or reduce interdiffusion of aluminum and silicon, and thus prevent aluminum spikes from extending through the sources and drains.

With reference to FIGS. 1-7, and in accordance with the invention, an MOS IC which includes an n-channel MOSFET is fabricated by forming relatively thin GOXs 30 and a relatively thick FOX 40 on the surface of a layer of doped semiconductor material 20. The layer 20 constitutes the surface active layer of a substrate 10 of semiconductor material. If the MOS IC includes both n-channel and p-channel MOSFETs, then the substrate 10 will necessarily include both p-type and n-type bulk regions. In what follows, it is assumed the n-channel MOSFET is fabricated in a p-type bulk region having a doping level of, for example, $10^{16}$ cm$^{-3}$.

The relatively thick FOX 40 separates the GOX-covered GASAD (gate-and-source-and-drain) areas 50, on the surface of the layer 20, where MOSFETs are to be formed. If, for example, the active layer 20 is of silicon, then the GOXs 30 and the FOX 40 will typically be, respectively, relatively thin and thick layers of $SiO_2$. The FOX 40 is formed, for example, by thermally oxidizing the surface of the layer 20. After opening windows in the FOX (by conventional techniques) to expose the GASAD areas 50 on the surface of the layer 20, the GOXs 30 are formed, for example, by again thermally oxidizing the surface of the layer 20. In the case of, for example, VLSI (very large scale integrated) MOS ICs, the thickness of the $SiO_2$ GOXs 30 ranges from about 150 Å to about 1000 Å and is preferably about 200 Å. Thicknesses of the GOXs 30 less than about 150 Å are undesirable because such thin layers are likely to undergo dielectric breakdown. On the other hand, thicknesses greater than about 1000 Å are undesirable because device operation requires the application of undesirably high voltages.

The thickness of the $SiO_2$ FOX 40 of the MOS IC range from about 2000 Å to about 8000 Å and is preferably about 4000 Å. A thickness less than about 2000 Å is undesirable because voltages applied to runners may invert underlying semiconductor material. On the other hand, a thickness greater than about 8000 Å is undesirable because so thick a layer makes it difficult to subsequently achieve conformal deposition of metals, such as aluminum.

After the GOXs 30 and FOX 40 are formed, a layer of gate material, e.g., a layer of polysilicon, is deposited onto the GOXs as well as onto the FOX, and then patterned (by conventional techniques) to form the gates 60. The thickness of the deposited gate material, and thus the thickness of the gates, ranges from about 2000 Å to about 8000 Å, and is preferably about 6000 Å. Thicknesses less than about 2000 Å are undesirable because such thin layers have undesirably high sheet resistance and may be excessively eroded during etching of the via holes through the interlevel dielectric. Thicknesses greater than about 8000 Å are undesirable because it is difficult to achieve essentially vertical, gate sidewalls when etching such thick layers.

While using the gates 60 as deposition masks, dopants (which are subsequently diffused into the active layer 20 to form the sources and drains of the MOSFETs) are implanted into the active layer 20, on opposite sides of the gates. In the case of the n-channel MOSFET, and if the active layer 20 is, for example, of (p-type) silicon, then the useful dopants (for forming $n^+$ sources and drains) include, for example, phosphorus, arsenic, and antimony. Moreover, the incident energies of these dopants ranges from about 10 keV to about 300 keV, and is preferably about 100 keV. Energies less than about 10 keV are undesirable because the resulting junctions are undesirably shallow. Energies greater than about 300 keV are undesirable because the resulting junctions are undesirably deep, i.e., extend to a depth greater than 1 $\mu$m after diffusion.

If the MOS IC also includes p-channel MOSFETs, e.g., the MOS IC is a CMOS IC, then the substrate 10 will also include an n-type bulk region (in which the p-channel MOSFETs are formed) having a typical doping level of about $10^{16}$ cm$^{-3}$. In addition, the useful p-type dopants to be implanted into the active layer of the n-type bulk region, e.g., n-type silicon, for subsequently forming the sources and drains of the p-channel MOSFETs, include boron, aluminum, and gallium. The incident energies of these dopants is generally the same as that given above.

An interlevel dielectric 70 is now deposited onto the FOX 40, the gates 60, as well as onto the implanted portions of the GASAD regions 50. The interlevel dielectric 70 includes, for example, $SiO_2-P_2O_5$ or $SiO_2-P_2O_5-B_2O_3$, materials which are readily deposited using conventional CVD techniques. The thickness of the interlevel dielectric 70 ranges from about $\frac{1}{2}$ $\mu$m to about 2 $\mu$m, and is preferably about 1 $\mu$m. Thicknesses less than about $\frac{1}{2}$ $\mu$m are undesirable because such thin layers are relatively poor insulators. Thicknesses greater than about 2 $\mu$m are undesirable because such thick layers result in relatively poor step coverage during subsequent metallization.

The upper surface of the deposited interlevel dielectric 70 is typically nonplanar (which is generally undesirable during subsequent processing). To induce the interlevel dielectric 70 to flow, and thus achieve surface planarity, as well as to drive the implanted dopants into the active layer 20 to form sources 80 and drains 90, the substrate is heated to temperatures ranging from about 850 degrees C. to about 1100 degrees C., over corresponding time periods ranging from about 1 hour to about 2 hours. Temperatures less than about 850 degrees C., and heating times less than about 1 hour, are undesirable because they produce an undesirably small amount of glass flow. Further, temperatures greater than about 1100 degrees C., and heating times greater than about 2 hours, are undesirable because they produce undesirably deep junctions.

After the formation of the sources and drains, the interlevel dielectric is patterned (using conventional techniques) to open via holes 100, 110, and 120 to, respectively, the sources, drains, and gates. If the electrical contacts (to be subsequently formed) to the sources, drains and gates are to include aluminum, and the substrate 10 is of silicon, then a barrier (130, 140) to the interdiffusion of aluminum and silicon is formed over each source and drain. The diffusion barrier includes, for example, a region of tungsten. Alternatively, this barrier includes a region of titanium, tantalum, molybdenum or rhenium. The thickness of the diffusion barrier ranges from about 300 Å to about 1500 Å, and is preferably about 1000 Å. Thicknesses less than about 300 Å are undesirable because such thin regions are relatively poor diffusion barriers. Thicknesses greater than 1500 Å are undesirable because, for example, they lead to loss of selectivity in tungsten formation.

If the diffusion barriers 130 and 140 are of tungsten, then useful thicknesses of tungsten are readily selectively formed on the sources and drains by reacting $WF_6$ and $H_2$. Moreover, and to reduce the excessive etching of the $n^+$ sources and drains, excess $SiF_4$ is also introduced. The flow rate of the $WF_6$ ranges from about 1 sccm to about 30 sccm, and is preferably about 10 sccm. A flow rate less than about 1 sccm is undesirable because it results in an undesirably low rate of tungsten formation. A flow rate greater than about 30 sccm is undesirable because it leads to excessive corrosion of the apparatus used in forming the tungsten.

The flow rate of the $H_2$ ranges from about 100 sccm to about 5000 sccm, and is preferably about 2000 sccm. Flow rates less than about 100 sccm are undesirable because they lead to excessive silicon erosion. Flow rates greater than about 5000 sccm are undesirable because they lead to undesirably high total pressures.

The flow rate of the $SiF_4$ ranges from 1 sccm to about 100 sccm, and is preferably about 20 sccm. Flow rates less than about 1 sccm and greater than about 100 sccm are undesirable for the reasons given above.

The total pressure of the gases involved in the selective formation procedure ranges from about 100 millitorr to about 2 torr, and is preferably about 1 torr. In addition, the reaction temperature ranges from about 250 degrees C. to about 600 degrees C., and is preferably about 300 degrees C. or about 550 degrees C. Total pressures less than about 100 millitorr, and reaction temperatures less than about 250 degrees C., are undesirable because they result in relatively low tungsten formation rates. Total pressures greater than about 2 torr are undesirable because they can lead to gas-phase nucleation of tungsten, rather than nucleation on the surfaces of the sources and drains. Reaction temperatures greater than about 600 degrees C. are undesirable because they result in a loss of selectivity in tungsten formation.

After the formation of the diffusion barriers 130 and 140, a layer of metal 160, e.g., an aluminum layer, is deposited onto the interlevel dielectric 70, as well as into the via holes leading to the sources, drains and gates. The thickness of the layer 160 ranges from about $\frac{1}{2}$ μm to about 2 μm. Thicknesses less than about $\frac{1}{2}$ μm are undesirable because they lead to undesirably high sheet resistance. Thicknesses greater than about 2 μm are undesirable because it is difficult to achieve essentially vertical sidewalls during the patterning of such thick layers. Subsequent to deposition, the metal layer 160 is patterned, e.g., selectively reactive ion etched, to form interconnecting metal runners which terminate in metal contact pads. The resulting substrate is then annealed at temperatures of, for example, 450 degrees C. for about 1 hour to eliminate radiation damage incurred during the reactive ion etching.

The MOS IC is finally completed by a series of conventional steps which typically includes the deposition of a silicon nitride layer, by the conventional technique of plasma-enhanced CVD, onto the IC to form a barrier against moisture and mechanical damage.

The MOS IC, described above, is distinguishable from previous such ICs in that the formation of the diffusion barriers results in n+ sources and drains which are substantially free of erosion. (A source or drain is substantially free of erosion, for purposes of the invention, provided the length of a perpendicular extending from a least-squares-fit planar approximation to the original substrate surface to the lowest point of the interface between the diffusion barrier and the source or drain is less than or equal to about 300 Å.) In addition, and quite unexpectedly, the metal contacts to all the sources and drains of the IC, including the source and drain of the n-channel MOSFET, exhibit contact resistivities which are less than about $10^{-6}$ohm-cm$^2$, and typically even less than about $5 \times 10^{-7}$ohm-cm$^2$. Significantly, these unexpectedly low contact resistivities are thermally stable, i.e., essentially unaffected by conventional annealing procedures, such as the one described above. Consequently, the resulting contact resistances are both thermally stable and significantly lower than was previously achievable. (For purposes of the invention, the contact resistivity to a source or drain is the multiple of the contact resistance, $R_c$, to the source or drain and the area, A, of the upper surface of the source or drain. The former is readily determined by first measuring the currentvoltage (I-V) curve across a region of the device substrate containing the source or drain. The area, A, of the upper surface, and the depth, d, of the source or drain are then measured using conventional techniques such as scanning electron microscopy, transmission electron microscopy, or secondary ion mass spectroscopy. Based upon the measured values of A and d, the ideal I-V curve for the source or drain is then calculated as taught, for example, in S. M. Sze, *Physics of Semiconductor Devices*, (John Wiley and Sons, N.Y.), 2nd edition, p. 304. Typically, the measured I-V curve will be displaced from the theoretical I-V curve by a constant amount. Significantly, $R_c$ is related to this displacement, i.e., $R_c = \Delta V/I$, where $\Delta V$ denotes the difference in the voltage values between the two I-V curves corresponding to a fixed current, I. Alternatively, $R_c$ is readily measured by applying an increasing, forward-biasing voltage across the source or drain, and measuring the corresponding values of dV/dI, the derivative of the applied voltage with respect to the resulting source/drain current. The contact resistance is equal to the value of dV/dI at saturation, i.e., when dV/dI stops changing with increasing forward-bias.)

While not essential to the invention, the above MOS IC is preferably fabricated to include a region of metal silicide, i.e., cobalt silicide, titanium silicide, platinum silicide, tantalum silicide, or molybdenum silicide, on the sources and drains, prior to forming the diffusion barriers, as described above. The metal silicide regions are advantageous because they result in thermally stable contact resistivities to the sources and drains of the MOS IC, including the source and drain of the n-channel MOSFET, which are even lower than those described above, i.e., lower than about $10^{-6}$ohm-cm$^2$, and even lower than about $10^{-7}$ohm-cm$^2$. Useful thicknesses of the metal silicide range from about 300 Å to about 1000 Å. Thicknesses less than about 300 Å are undesirable because such thin layers are often incapable of preventing the overlying metal from penetrating to the substrate, resulting in increased contact resistivities. Thicknesses greater than about 1000 Å are undesirable because such thick layers require the consumption of an undesirably large amount of substrate material during silicide formation.

Preferably, the metal silicide regions are formed by depositing, e.g., rf-sputtering, the corresponding pure metal into the via holes in the interlevel dielectric, and then sintering (thus reacting the metal with the silicon of the sources and drains) in an inert atmosphere of, for example, argon. Useful thicknesses of deposited metal range from about 150 Å to about 500 Å. Thicknesses less than about 150 Å and greater than about 500 Å are undesirable because they yield metal silicide thicknesses which are outside the range, given above. Useful sintering temperatures, and corresponding sintering times, range from about 300 degrees C. and about 1 hour to about 1000 degrees C. and about 1 hour. Sintering temperatures less than about 300 degrees C., and sintering times less than about 1 hour, are undesirable because they yield incomplete reactions between the metal and the silicon. Sintering temperatures greater than about 1000 degrees C., and sintering times greater than about 1 hour, are undesirable because they lead to undesirable reactions between the metal in the metal silicide and both silicon and silicon dioxide.

The use of the above-described sintering procedure to form the metal silicide regions does produce some erosion of the sources and drains. However, this erosion is typically relatively small compared to the erosion produced by the undesirable reaction between $WF_6$ and the silicon of the sources and drains.

Significantly, the metal silicide regions are generally porous, and thus permit reactive entities, such as $WF_6$, to react with, and thus erode, the silicon of the sources and drains. Moreover, the $WF_6$ tends to leach out, and react with, the silicon of the metal silicides. As a consequence, the above-described inventive techniques are essential to preventing the erosion of the metal silicides, and to achieving substantially erosion-free sources and drains. (For purposes of the invention, a diffusion barrier-and-metal silicide-covered source or drain is substantially free of erosion provided the length of a perpendicular extending from a particular imaginary plane to the lowest point of the interface between the metal silicide and the source or drain is less than or equal to about 300 Å. The imaginary plane of interest is positioned below (within the substrate), and is parallel to, the least-squares-fit planar approximation to the original substrate surface. In addition, the length of a perpendicular extending between the two planes is equal to the thickness of the corresponding, uniform layer of silicon consumed in forming the metal silicide. This thickness is readily inferable from the amount of metal in the metal silicide, which is readily determined using, for example, conventional Rutherford Back-Scattering techniques. If the source of silicon used in forming the metal silicide is not the source or drain, then the imaginary plane is just the least-squares-fit planar approximation to the original substrate surface.)

EXAMPLE

Two groups of silicon wafers, of opposite conductivity type, were processed, as described below. The first group, here denoted Group I, included 25 p-type wafers exhibiting resistivities of 20–100 Ω-cm. The second group, here denoted Group II, included 25 n-type wafers exhibiting resistivities of 10–20 Ω-cm.

Initially, a silicon dioxide layer, having a thickness of about 100 Å, was thermally grown on each wafer. Then, relatively heavily doped p-type bulk regions were formed in the Group I wafers, and relatively heavily doped n-type bulk regions were formed in the Group II wafers, to simulate the p-tubs and n-tubs employed in CMOS devices. This was achieved by implanting boron ions (30 keV, $4 \times 10^{12} cm^{-2}$) into the Group I wafers, phosphorus ions (100 keV, $2 \times 10^{12} cm^{-2}$) into the Group II wafers, and then diffusing the ions into the wafers by heating the wafers to 1100 degrees C. for 2 hours.

A layer of silicon nitride, having a thickness of about 1200 Å, was deposited onto each of the Group I and Group II wafers, using conventional LPCVD techniques. The silicon nitride layer on each wafer was then selectively reactive ion etched, in an atmosphere of $CHF_3$ and $O_2$. A field oxide (FOX), having a thickness of about 6000 Å, was thermally grown on the resulting, exposed surface regions of each wafer. After stripping away the silicon nitride, a gate oxide (GOX), having a thickness of about 250 Å, was thermally grown on each wafer, on the surface regions previously covered by the silicon nitride.

To ultimately form what are, in effect, source and drain regions within the wafers, the Group I wafers received a 100 keV arsenic (an n-type dopant) implant, at various doses ranging from $8 \times 10^{14} cm^{-2}$ to $1 \times 10^{16} cm^{-2}$, the arsenic penetrating the GOX-covered regions but not the FOX-covered regions. Similarly, the Group II wafers received a 50 keV boron-difluoride (a p-type dopant) implant, at various doses ranging from $8 \times 10^{14} cm^{-2}$ to $1 \times 10^{16} cm^{-2}$.

An interlevel dielectric, consisting of a 2000 Å-thick layer of undoped silicon dioxide, was deposited onto each wafer, using conventional LPCVD techniques. (The interlevel dielectrics were undoped to avoid contaminating p+ regions with phosphorus, an n-type dopant.) The interlevel dielectrics were then densified by heating the wafers to 900 degrees C. for 30 minutes. In addition, the interlevel dielectrics were flowed, to planarize their upper surfaces, and the arsenic and phosphorus implants were activated and diffused into the wafers to form source/drain regions, by heating the wafers in an argon atmosphere at 950 degrees C. for 60 minutes.

The interlevel dielectrics were selectively wet etched, using buffered HF, to form via holes to the source/drain regions. (Reactive ion etching was specifically avoided to preclude silicon erosion due to such etching.) Although the via holes were intended to be square, with 1.25 μm-long sides (as would have been achieved using anisotropic, reactive ion etching), the isotropic etching produced by the HF tended to widen the via holes to squares having sides as long as 2.2 μm.

The processed wafers were separated into three categories (Categories I, II and III). Categories I and II each included p-type (Group I) wafers having each of the various arsenic implant levels and n-type (Group II) wafers having each of the various boron-difluoride implant levels. Category III included one p-type wafer and one n-type wafer.

A layer of tungsten was selectively deposited onto the source/drain regions of the Category I wafers, using a two-step process. That is, a tungsten film, having a thickness of about 150 Å, was initially selectively deposited (via the reaction given in Eq. (1)) onto the Category I wafers by flowing $WF_6$ across the wafers, for approximately 1 minute, at a temperature of 290 degrees C. The total pressure within the deposition chamber was 3 torr, the partial pressure of the $WF_6$ being 5 millitorr and the partial pressure of the argon constituting the remainder of the total pressure. An additional layer of tungsten, having a thickness of about 500 Å, was then selectively deposited (via the reaction given in Eq. (2)) by flowing $WF_6$ and $H_2$ across the wafers, for approximately 15 minutes, at a temperature of 290 degrees C. The total pressure within the deposition chamber was 1.4 torr, the partial pressure of the $WF_6$ being 10 millitorr and the partial pressure of the $H_2$ accounting for the remainder of the total pressure.

A layer of tungsten, having a thickness of about 500 Å, was selectively deposited onto the source/drain regions of the Category II wafers by flowing $WF_6$, $H_2$ and $SiF_4$ across the wafers, for approximately 15 minutes, at a temperature of 290 degrees C. The total pressure within the deposition chamber was 1.42 torr, the partial pressure of the $WF_6$ being 10 millitorr, the partial pressure of the $SiF_4$ being 20 millitorr, and the partial pressure of the $H_2$ constituting the remainder of the total pressure.

The processing of the Category III wafers differed from that of the Category II wafers only in that a layer of platinum silicide was formed on the source/drain regions prior to tungsten formation. That is, the Category III wafers were initially cleaned with a $HNO_3/H_2SO_4$ solution. Then, a 200 Å-thick layer of platinum was sputter deposited onto the upper surfaces of the wafers, and the wafers were sintered at 650 degrees C. for 15 minutes in a gaseous atmosphere which included 90 percent (by volume) argon and 10 percent oxygen. As a consequence, a layer of platinum silicide, having a thickness of about 400 Å, was selectively formed on the exposed, upper surfaces of the sources and drains. The remaining, unreacted platinum was removed using aqua regia. A 100:1 HF solution was used to clean these wafers prior to tungsten formation.

Following the selective tungsten deposition procedures, all the wafers in Categories I, II and III were metallized, i.e., a 1 μm-thick film of Al-½ percent Cu was sputtered onto each wafer. The aluminum on the interlevel dielectrics was then selectively reactive ion etched, in a $BCl_3/Cl_2$ atmosphere, to form runners terminating in contact pads.

The contact resistance to the source and drain regions of all the wafers was measured, as a function of source/drain surface doping concentration, $N_D$, using the conventional Kelvin technique (see, e.g., R. A. Levy, "In-Source Al-0.5% Cu Metallization for CMOS Devices," Journal of the Electrochemical Society, Vol. 132, p. 159, 1985). To test the thermal stability of these contact resistances, the wafers were sintered at 330 degrees C. for 45 minutes, and subsequently at 450 degrees C. for 45 minutes, and the contact resistances were measured after each sintering procedure.

Figure 8:
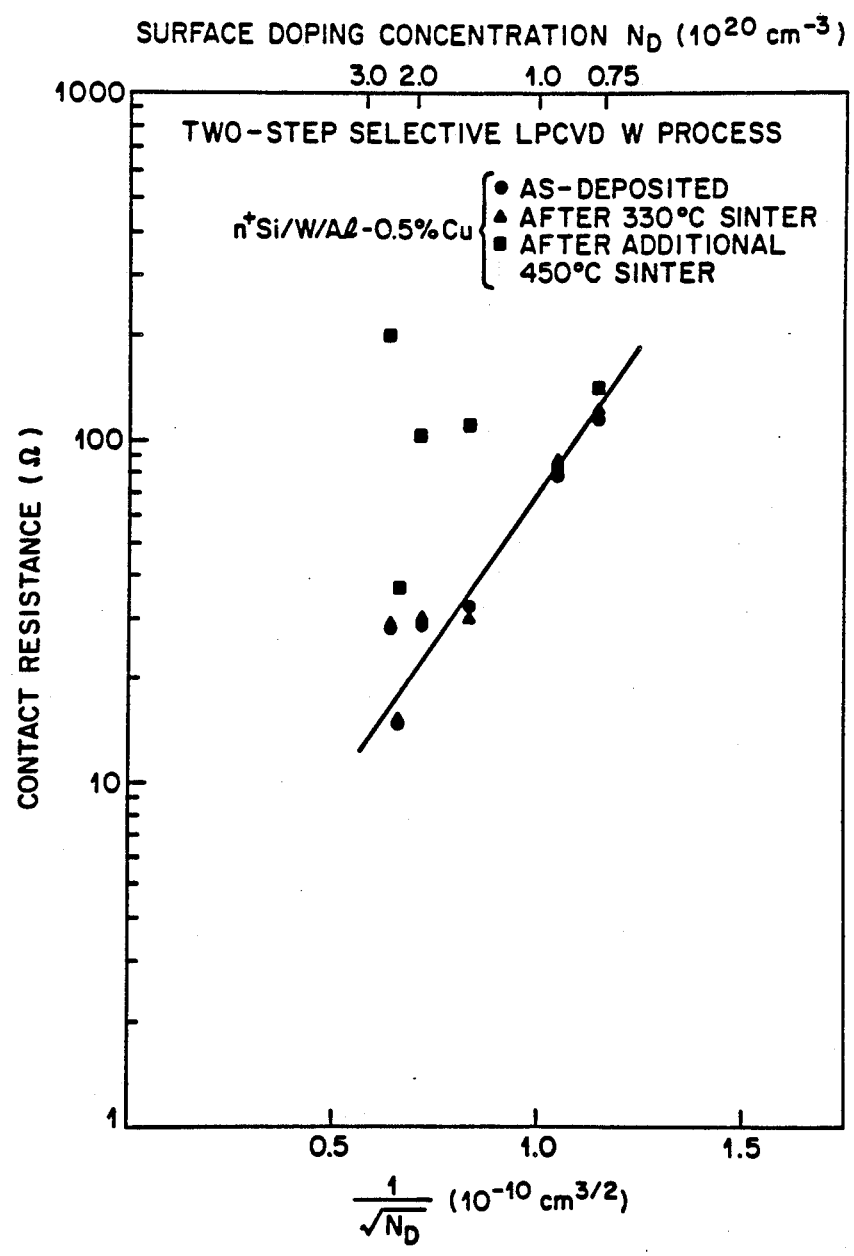
FIGS. 8-10 depict device contact resistances achieved using previous fabrication methods and the inventive device fabrication method.
Figure 9:
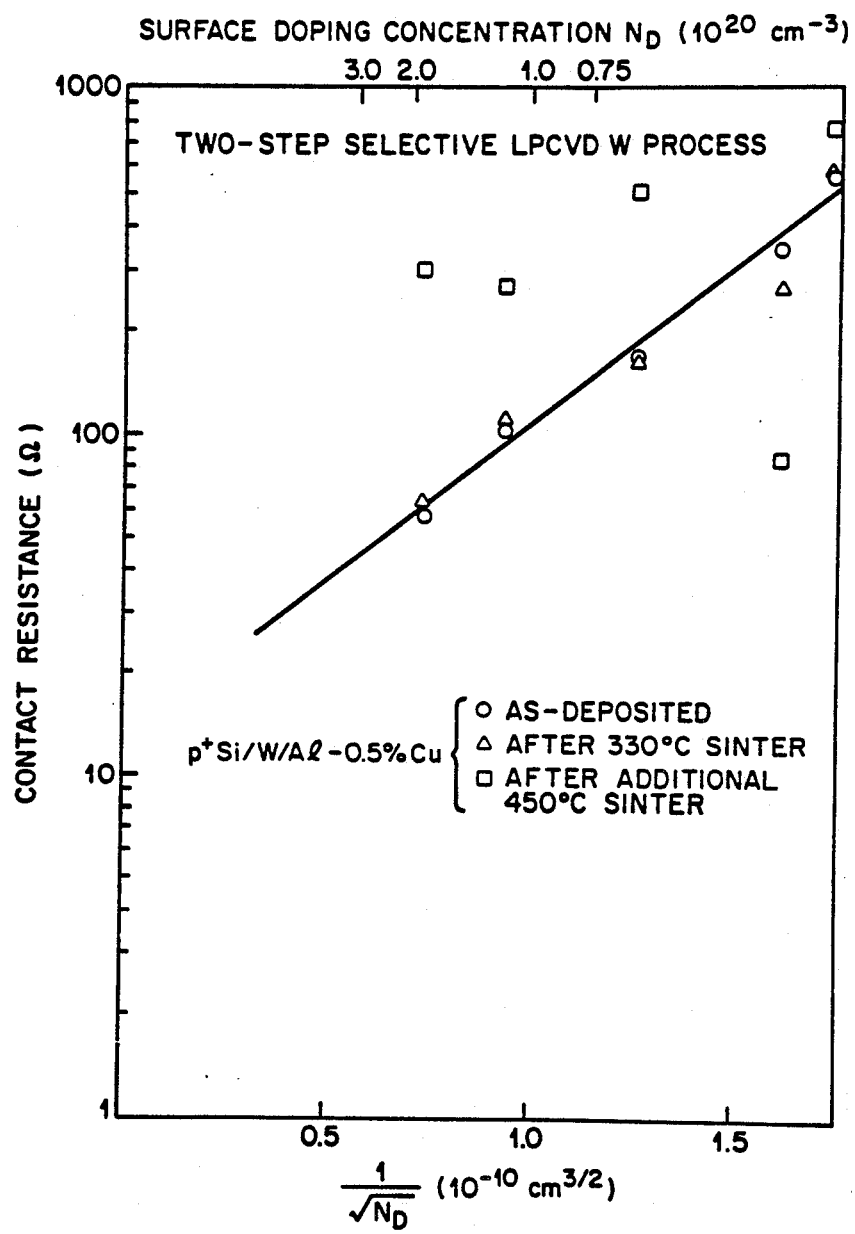
Figure 10:
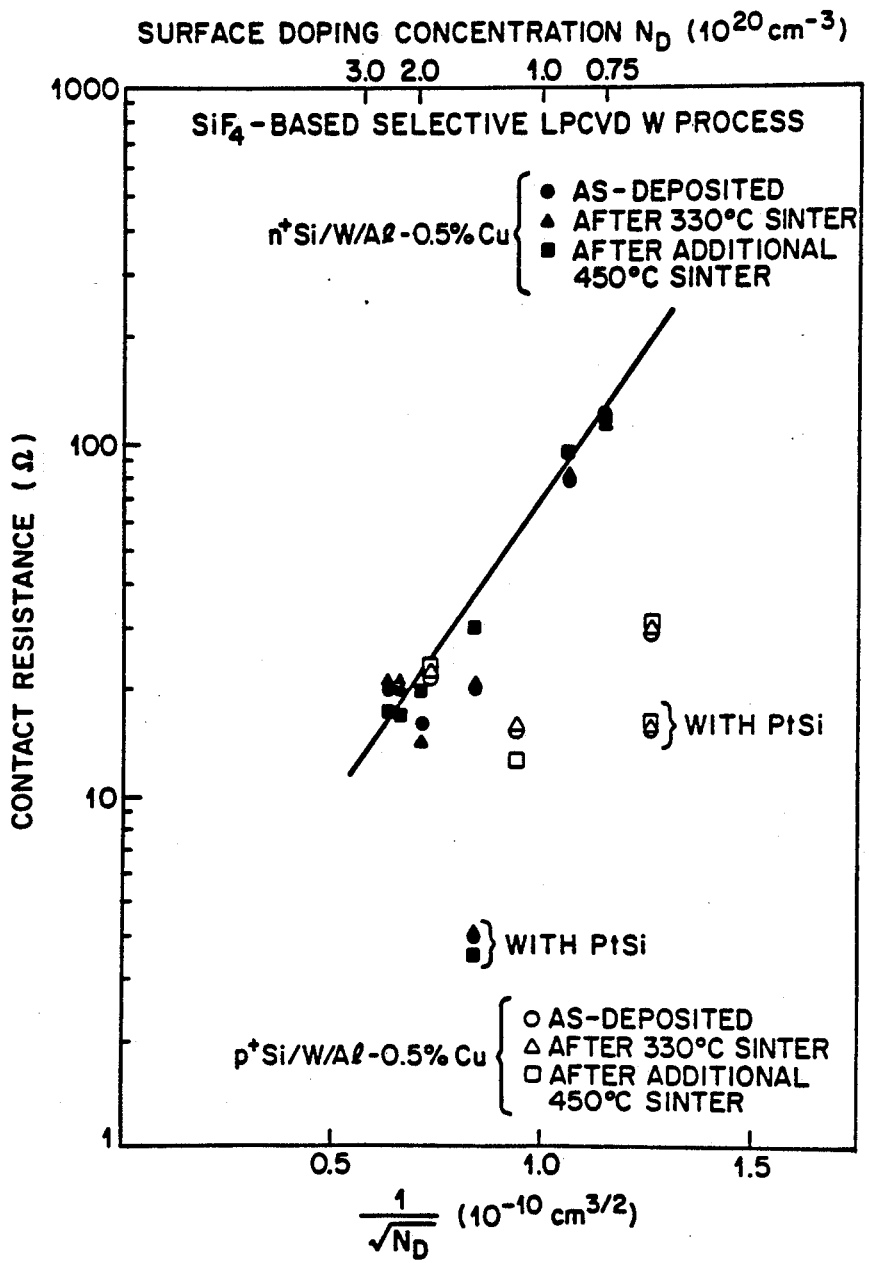

The measured contact resistances, as a function of $N_D$, are plotted in FIGS. 8-10. As is evident from FIGS. 8-9, which depict the results achieved with the Category I wafers, the contact resistances to p+ source/drain regions were higher than to n+ regions, at equivalent surface doping concentrations. In addition, the contact resistances to both n+ and p+ regions were thermally unstable, i.e., significantly increased after the sintering procedures.

FIG. 10 depicts the results achieved with the Category II and Category III wafers. As is evident, the contact resistances to the p+ regions in the Category II wafers were equal to, or lower than, the contact resistances to the n+ regions, and both sets of contact resistances were thermally stable. In addition, the Category III wafers exhibited significantly reduced, thermally stable contact resistances to both the n+ and p+ regions.

Scanning electron, and transmission electron, micrographs were made of samples taken from the Category I, II and III wafers. These micrographs indicated that the source and drain regions in the Category II and III wafers suffered much less vertical and lateral erosion than did the corresponding regions in the Category I wafers.

What is claimed is:

1. A method for fabricating a device, comprising the steps of:
    forming a metal-containing material on a region of a substrate which includes silicon of n-type conductivity, said forming step including exposing the region to an atmosphere, associated with the atmosphere being a total pressure, the atmosphere comprising at least a first and a second reactive entity, and said forming step further including the step of reacting, at one or more reaction conditions, at least the first reactive entity, including a metal halide, with at least the second reactive entity and with said silicon, the reaction between said first and second entities yielding a product which includes said metal-containing material; and
    completing the fabrication of said device, characterized in that
    said reacting step includes the step of reducing the forward reaction rate between said first reactive entity and said silicon, during at least a portion of the duration of at least one of said reaction conditions, below the corresponding, inherent forward reaction rate without a substantial reduction in the corresponding forward reaction rate between said first and second reactive entities; and
    said total pressure is in the range from greater than 1.42 torr to about 2 torr.

2. The method of claim 6 wherein said metal fluoride is $WF_6$.

3. The method of claim 1 wherein said second reactive entity includes $H_2$.

4. The method of claim 1 wherein said reducing step includes the step of increasing the concentration of a product of the reaction between said first reactive entity and said silicon above the corresponding stoichiometric amount without increasing the concentrations of said first and second entities.

5. The method of claim 6 wherein said product of the reaction between said first reactive entity and said silicon includes $SiF_4$.

6. The method of claim 1 wherein said metal halide includes a metal fluoride.

7. The method of claim 1 wherein said first reactive entity includes a metal chloride.

8. The method of claim 6 wherein said metal fluoride is $MoF_6$.

9. The method of claim 6 wherein said metal fluoride is $ReF_6$.

10. The method of claim 7 wherein said metal chloride is $TaCl_5$.

11. The method of claim 7 wherein said metal chloride is $TiCl_4$.

12. The method of claim 1 wherein said second reactive entity includes $SiH_4$.

13. A method for fabricating a device, comprising the steps of:
    forming material, including elemental metal, on a region of a substrate which includes silicon of n-type conductivity, said forming step including exposing the region to an atmosphere, associated with the atmosphere being a total pressure, the atmosphere comprising at least a first and a second reactive entity, and said forming step further including the step of reacting, at one or more reaction conditions, at least the first reactive entity, including a metal halide, with at least the second reactive entity and with said silicon, the reaction between said first and second entities yielding a product which includes said elemental metal; and
    completing the fabrication of said device, characterized in that,
    said reacting step includes the step of reducing the forward reaction rate between said first reactive entity and said silicon, during at least a portion of the duration of at least one of said reaction conditions, below the corresponding, inherent forward reaction rate without a substantial reduction in the corresponding forward reaction rate between said first and second reactive entities; and
    said total pressure is in the range from greater than 1.42 torr to about 2 torr.

14. The method of claim 13, wherein said second reactive entity includes molecular hydrogen.

15. A method for fabricating a device, comprising the steps of:
    forming material, including elemental metal, on a region of a substrate which includes silicon of n-type conductivity, said forming step including exposing the region to an atmosphere, associated with the atmosphere being a total pressure, the atmosphere comprising at least a first and a second reactive entity, and said forming step further including the step of reacting, at one or more reaction conditions, at least the first reactive entity, including a metal halide, with at least the second reactive entity and with said silicon, the reaction between said first and second entities yielding a product which includes said elemental metal; and completing the fabrication of said device, characterized in that said reacting step includes the step of reducing the forward reaction rate between said first reactive entity and said silicon, during at least a portion of the duration of at least one of said reaction conditions, below the corresponding, inherent forward reaction rate, said reducing being greater than any corresponding reduction in the corresponding forward reaction rate between said first and second reactive entities; and said total pressure is in the range from greater than 1.42 torr to about 2 torr.

16. The method of claim 15, wherein said second reactive entity includes molecular hydrogen.

17. A method for fabricating a device, comprising the steps of:

forming material, including elemental tungsten, on a region of a substrate which includes silicon of n-type conductivity, said forming step including exposing the region to an atmosphere, associated with the atmosphere being a total pressure, the atmosphere comprising at least a first and a second entity, and said forming step further including the step of reacting, at one or more reaction conditions, at least the first reactive entity, including tungsten hexafluoride, with at least the second reactive entity, including molecular hydrogen, and with said silicon, the reaction between said first and second entities yielding a product which includes elemental tungsten; and completing the fabrication of said device, characterized in that said reacting step includes the step of reducing the forward reaction rate between said first reactive entity and said silicon, during at least a portion of the duration of at least one of said reaction conditions, below the corresponding, inherent forward reaction rate without a substantial reduction in the corresponding forward reaction rate between said first and second reactive entities; and said total pressure is in the range from greater than 1.42 torr to about 2 torr.

18. A method for fabricating a device, comprising the steps of:

forming material, including elemental tungsten, on a region of a substrate which includes silicon of n-type conductivity, said forming step including exposing the region to an atmosphere, associated with the atmosphere being a total pressure, the atmosphere comprising at least a first and a second reactive entity, and said forming step further including the step of reacting, at one or more reaction conditions, at least the first reactive entity, including tungsten hexafluoride, with at least the second reactive entity, including molecular hydrogen, and with said silicon, the reaction between said first and second entities yielding a product which includes elemental tungsten; and completing the fabrication of said device, characterized in that said reacting step includes the step of reducing the forward reaction rate between said first reactive entity and said silicon, during at least a portion of the duration of at least one of said reaction conditions, below the corresponding, inherent forward reaction rate, said reducing being greater than any corresponding reduction in the corresponding forward reaction rate between said first and second reactive entities; and said total pressure is in the range from greater than 1.42 torr to about 2 torr.

* * * * *